(12) United States Patent
Hasegawa

(10) Patent No.: US 10,221,486 B2
(45) Date of Patent: Mar. 5, 2019

(54) LAMINATE FILM, ORGANIC ELECTROLUMINESCENCE DEVICE, PHOTOELECTRIC CONVERSION DEVICE, AND LIQUID CRYSTAL DISPLAY

(71) Applicant: SUMITOMO CHEMICAL COMPANY, LIMITED, Tokyo (JP)

(72) Inventor: Akira Hasegawa, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 240 days.

(21) Appl. No.: 15/023,444

(22) PCT Filed: Sep. 16, 2014

(86) PCT No.: PCT/JP2014/074980
§ 371 (c)(1),
(2) Date: Mar. 21, 2016

(87) PCT Pub. No.: WO2015/046092
PCT Pub. Date: Apr. 2, 2015

(65) Prior Publication Data
US 2016/0208384 A1    Jul. 21, 2016

(30) Foreign Application Priority Data

Sep. 27, 2013 (JP) ................................. 2013-200937
Aug. 29, 2014 (JP) ................................. 2014-175088

(51) Int. Cl.
*C23C 16/00* (2006.01)
*C23C 16/50* (2006.01)
(Continued)

(52) U.S. Cl.
CPC ............ *C23C 16/50* (2013.01); *C23C 16/401* (2013.01); *C23C 16/42* (2013.01); *C23C 16/503* (2013.01);
(Continued)

(58) Field of Classification Search
None
See application file for complete search history.

(56) References Cited

U.S. PATENT DOCUMENTS 9,011,994 B2   4/2015  Hasegawa et al.
2002/0001725 A1* 1/2002 Ichimura ............... C23C 16/401
                                                        428/446

(Continued)

FOREIGN PATENT DOCUMENTS

JP    2005-283561 A    10/2005
JP    2011-73430 A      4/2011
(Continued)

OTHER PUBLICATIONS

Japanese Industrial Standard, "Test method for visible light transmittance of fine ceramic thin films," Japanese Standards Association, JIS R 1635: 1998 (4 pages).
(Continued)

*Primary Examiner* — Robert S Loewe
(74) *Attorney, Agent, or Firm* — Sughrue Mion, PLLC

(57) ABSTRACT

Provided is a laminate film having a substrate and at least one thin film layer which is formed on at least one surface of the substrate, wherein
at least one of the thin film layers satisfies all of the following conditions (i) to (iv):
(i) silicon atoms, oxygen atoms, and carbon atoms are contained,
(ii) a content ratio X (at %) of the number of carbon atoms relative to a sum of the number of silicon atoms, the number of oxygen atoms, and the number of carbon atoms is 3 to 25 at %,
(iii) an average density d (g/cm$^3$) is 2.12 g/cm$^3$ or higher and is less than 2.25 g/cm$^3$, and
(iv) the content ratio X (at %) of the number of carbon atoms and the average density d (g/cm$^3$) satisfy a condition represented by the following formula (1):

$$d > (2.22 - 0.008X) \tag{1}$$

12 Claims, 3 Drawing Sheets

(51) Int. Cl.
  C23C 16/42   (2006.01)
  H01L 51/00   (2006.01)
  H01L 51/44   (2006.01)
  H01L 51/52   (2006.01)
  C23C 16/40   (2006.01)
  C23C 16/503  (2006.01)
  C23C 16/54   (2006.01)
  H01J 37/32   (2006.01)

(52) U.S. Cl.
  CPC ........ *C23C 16/545* (2013.01); *H01J 37/3266* (2013.01); *H01J 37/3277* (2013.01); *H01L 51/0097* (2013.01); *H01L 51/448* (2013.01); *H01L 51/5253* (2013.01); *Y02E 10/549* (2013.01); *Y02P 70/521* (2015.11)

(56) References Cited

U.S. PATENT DOCUMENTS

| | | | | |
|---|---|---|---|---|
| 2008/0085418 A1* | 4/2008 | Fukuda | ............... | B32B 7/02 |
| | | | | 428/447 |
| 2008/0124946 A1* | 5/2008 | Xiao | ............... | C23C 16/345 |
| | | | | 438/784 |
| 2009/0104392 A1* | 4/2009 | Takada | ............... | C23C 16/045 |
| | | | | 428/36.6 |
| 2012/0040107 A1* | 2/2012 | Hasegawa | ............ | C23C 16/401 |
| | | | | 428/1.1 |
| 2014/0224517 A1* | 8/2014 | Hasegawa | ............ | H01L 31/0481 |
| | | | | 174/50.5 |
| 2015/0044454 A1* | 2/2015 | Hasegawa | ............ | C04B 35/565 |
| | | | | 428/336 |
| 2015/0125679 A1* | 5/2015 | Ishikawa | ............ | C23C 16/402 |
| | | | | 428/216 |

FOREIGN PATENT DOCUMENTS

| | | | | |
|---|---|---|---|---|
| WO | 2012/176850 A1 | 12/2012 | | |
| WO | WO-2013146964 A1 * | 10/2013 | ........... | C04B 35/565 |
| WO | 2010/117046 A1 | 10/2014 | | |

OTHER PUBLICATIONS

Communication dated Nov. 28, 2016 issued by the Intellectual Property Office of People's Republic of China in counterpart application No. 201480052236.8.

Office Action dated Oct. 2, 2018 in corresponding Japanese Patent Application No. 2015-539178 with translation.

* cited by examiner

LAMINATE FILM, ORGANIC ELECTROLUMINESCENCE DEVICE, PHOTOELECTRIC CONVERSION DEVICE, AND LIQUID CRYSTAL DISPLAY

CROSS REFERENCE TO RELATED APPLICATIONS

This application is a National Stage of International Application No. PCT/JP2014/074980 filed Sep. 16, 2014, claiming priority based on Japanese Patent Application Nos. 2013-200937, filed Sep. 27, 2013, 2014-175088, filed Aug. 29, 2014, the contents of all of which are incorporated herein by reference in their entirety.

TECHNICAL FIELD

The present invention relates to a laminate film having a gas barrier property and also to an organic electroluminescence device, a photoelectric conversion device, and a liquid crystal display each having the laminate film.

BACKGROUND ART

A gas-barrier film is suitable as a packaging container for filling and packaging articles such as drinks and foods, cosmetics, and detergents. In recent years, there has been a proposal for a laminate film having a gas barrier property (hereafter, the film may be referred to simply as a "laminate film") which is obtained by using a plastic film or the like as a substrate and laminating an inorganic substance such as silicon oxide, silicon nitride, silicon oxynitride, or aluminum oxide on one surface of the substrate.

As a method for laminating a thin film of an inorganic substance on the surface of the plastic substrate, physical vapor deposition (PVD) methods such as the vacuum vapor deposition method, the sputtering method, and the ion plating method, and chemical vapor deposition (CVD) methods such as the reduced-pressure chemical vapor deposition method and the plasma chemical vapor deposition method are known. For example, Patent Document 1 discloses a laminate film having a thin film layer which contains silicon atoms, oxygen atoms, and carbon atoms.

PRIOR ART DOCUMENT

Patent Document

Patent Document 1: JP-A-2011-73430

SUMMARY OF THE INVENTION

Problems to be Solved by the Invention

However, the aforementioned laminate film has not been sufficiently satisfactory in terms of the gas barrier property.

The present invention has been made in view of such circumstances, and an object thereof is to provide a laminate film having a high gas barrier property. Also, another object of the present invention is to provide an organic electroluminescence device, a photoelectric conversion device, and a liquid crystal display each having the laminate film.

Means for Solving the Problems

In order to solve the aforementioned problems, one aspect of the present invention provides a laminate film having (that is, comprising) a substrate and at least one thin film layer which is formed on at least one surface of the substrate, wherein
at least one of the thin film layers satisfies all of the following conditions (i) to (iv):
(i) silicon atoms, oxygen atoms, and carbon atoms are contained,
(ii) a content ratio X (at %) of the number of carbon atoms relative to a sum of the number of silicon atoms, the number of oxygen atoms, and the number of carbon atoms is 3 to 25 at %,
(iii) an average density d ($g/cm^3$) is 2.12 $g/cm^3$ or higher and is less than 2.25 $g/cm^3$, and
(iv) the content ratio X (at %) of the number of carbon atoms and the average density d ($g/cm^3$) satisfy a condition represented by the following formula (1):

$$d > (2.22 - 0.008X) \tag{1}$$

In one aspect of the present invention, the thin film layer is preferably a layer which is formed by plasma chemical vapor deposition method.

In one aspect of the present invention, a film-forming gas used in the plasma chemical vapor deposition method preferably contains an organic silicon compound and oxygen.

In one aspect of the present invention, the thin film layer is preferably a layer which is formed by the plasma chemical vapor deposition method including disposing the substrate on a pair of film-forming rolls and generating plasma by electric discharging between the pair of film-forming rolls.

In one aspect of the present invention, polarities of the pair of film-forming rolls are preferably alternately inverted in electric discharging between the pair of film-forming rolls.

In one aspect of the present invention, the thin film layer is preferably a layer which is formed by the plasma chemical vapor deposition method having a magnetic field generation mechanism which is fixed, without rotating, in an inside of each of the pair of film-forming rolls.

In one aspect of the present invention, the substrate is preferably formed of at least one type of resin selected from the group consisting of a polyester resin and a polyolefin resin.

In one aspect of the present invention, the substrate is preferably formed of at least one type of resin selected from the group consisting of polyethylene terephthalate and polyethylene naphthalate.

One aspect of the present invention provides an organic electroluminescence device having (that is, comprising) the laminate film described above.

One aspect of the present invention provides a photoelectric conversion device having (that is, comprising) the laminate film described above.

One aspect of the present invention provides a liquid crystal display having (that is, comprising) the laminate film described above.

Effect of the Invention

According to the present invention, a laminate film having a high gas barrier property can be provided. Also, an organic electroluminescence device, a photoelectric conversion device, and a liquid crystal display each having the laminate film can be provided.

MODE FOR CARRYING OUT THE INVENTION

[Laminate Film]

The laminate film of the present embodiment is a laminate film having a substrate and at least one thin film layer which is formed on at least one surface of the substrate, wherein at least one of the thin film layers satisfies all of the aforesaid conditions (i) to (iv).

In the laminate film of the present embodiment, a thin film layer H may contain hydrogen atoms.

Hereafter, the laminate film according to the present embodiment will be described with reference to the drawings. Here, in all of the following drawings, dimension, ratio, and the like of each of the constituent elements have been modified as appropriate in order to make it easier to see the drawings.

Figure 1:
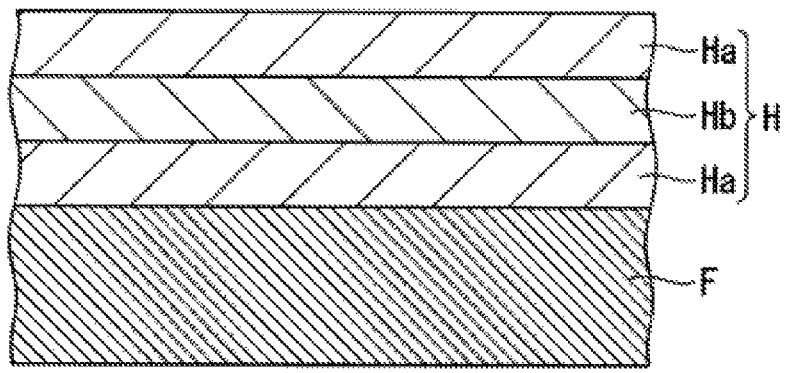
FIG. 1 is a schematic view showing an example of a laminate film of the present embodiment.

FIG. 1 is a schematic view showing an example of the laminate film of the present embodiment. In the laminate film of the present embodiment, the thin film layer H having a gas barrier property is laminated on the surface of a substrate F. In the thin film layer H, at least one of the thin film layers H contains silicon atoms, oxygen atoms, and hydrogen atoms. The thin film layer H includes a first layer Ha which contains a large amount of $SiO_2$ generated by complete oxidation reaction of a film-forming gas which will be described later, and a second layer Hb which contains a large amount of $SiO_xC_y$ generated by incomplete oxidation reaction. The thin film layer H has a three-layer structure in which the first layer Ha and the second layer Hb are alternately laminated on each other.

However, FIG. 1 schematically shows that there is a distribution of film composition, so that in reality there is no clear interface between the first layer Ha and the second layer Hb, and the composition changes continuously. The thin film layer H may have the aforementioned three-layer structure as one unit, and may be formed of a plurality of units laminated on each other. A method for producing the laminate film shown in FIG. 1 will be described later in detail.

(Substrate)

The substrate F included in the laminate film of the present embodiment is a flexible film formed of a polymer material.

When the laminate film of the present embodiment has light permeability, examples of the material for forming the substrate F include polyester resins such as polyethylene terephthalate (PET) and polyethylene naphthalate (PEN); polyolefin resins such as polyethylene (PE), polypropylene (PP), and cyclic polyolefin; polyamide resins; polycarbonate resins; polystyrene resins; polyvinyl alcohol resins; saponified substances of ethylene-vinyl acetate copolymers; polyacrylonitrile resins; acetal resins; and polyimide resins. Among these resins, polyester resins or polyolefin resins are preferable, and PET or PEN as the polyester resins is more preferable in terms of high heat resistance and small linear expansion coefficient. The above resins may be used either individually as one kind or in combination of two or more kinds.

Furthermore, when the light permeability of the laminate film is not considered as being important, composite materials obtained by adding a filler or an additive to the above resins, for example, can be used as the material for forming the substrate F.

The thickness of the substrate F may be appropriately set in consideration of the safety at the time of producing the laminate film. However, the thickness is preferably 5 μm to 500 μm, since the substrate may be easily transported even in vacuum. When the thin film layer H adopted in the present embodiment is formed by the plasma chemical vapor deposition method (plasma CVD method), electric discharge is generated through the substrate F, and consequently, the thickness of the substrate F is more preferably 50 μm to 200 μm, and particularly preferably 50 μm to 100 μm.

In addition, in order to enhance the adhesiveness between the substrate F and the thin film layer to be formed, the substrate F may be subjected to a surface activating treatment for cleaning the surface. Examples of the surface activating treatment include corona treatment, plasma treatment, and flame treatment.

(Thin Film Layer)

The thin film layer H included in the laminate film of the present embodiment is a layer that is formed on at least one surface of the substrate F, and at least one layer contains silicon atoms, oxygen atoms, and carbon atoms. The thin film layer H may further contain hydrogen atoms, nitrogen atoms, or aluminum atoms. Here, the thin film layer H may be formed on both surfaces of the substrate F.

(Density of Thin Film Layer)

The thin film layer H included in the laminate film of the present embodiment has an average density d of 2.12 $g/cm^3$ or higher. Preferably, the average density d is 2.15 $g/cm^3$ or higher from the viewpoint of the strength of the film. Also, the average density d of the film is less than 2.25 $g/cm^3$. Here, in the present specification, the "average density" of the thin film layer refers to a density that is determined by a method described in the later-mentioned "(5) Average density of thin film layer".

(Content Ratio of the Number of Carbon Atoms in Thin Film Layer)

In the thin film layer H included in the laminate film of the present embodiment, the content ratio X (at %) of the number of carbon atoms relative to the sum of the number of silicon atoms, the number of oxygen atoms, and the number of carbon atoms is 3 to 25 at %. From the viewpoint of bending resistance, the content ratio is preferably 5 at % or higher, and more preferably 7.2 at % or higher. From the viewpoint of the visible light permeability, the content ratio is preferably 20 at % or lower, and more preferably 12 at % or lower.

The content ratio of the number of carbon atoms in the thin film layer can be determined from a carbon distribution curve of the thin film layer.

(Carbon Distribution Curve in Thin Film Layer)

In the thin film layer H included in the laminate film of the present embodiment, a carbon distribution curve can be prepared showing a relationship between the distance from the surface of the thin film layer H in the thickness direction of the thin film layer H and the ratio of the carbon atomic number (carbon atom number ratio) relative to the sum of the number of silicon atoms, the number of oxygen atoms, and the number of carbon atoms at the distance.

Hereafter, the carbon distribution curve will be described.

The carbon distribution curve can be prepared by performing so-called XPS depth profile measurement in which sequential surface composition analysis is performed in a state where the inside of a sample is being exposed to the outside, by concurrently performing measurement of X-ray photoelectron spectroscopy (XPS: X-ray Photoelectron Spectroscopy) and ion sputtering utilizing a noble gas such as an argon gas.

In the carbon distribution curve obtained by XPS depth profile measurement, the ordinate represents a ratio of the number of carbon atoms (unit: at %), and the abscissa represents an etching time. In performing the XPS depth profile measurement, it is preferable to adopt the noble gas ion sputtering method utilizing argon ($Ar^+$) as an etching ion species and to set the etching speed (etching rate) to 0.05 nm/sec (value as converted in terms of $SiO_2$ thermal oxide film).

However, $SiO_xC_y$ contained in a large amount in the second layer of the thin film layer H is etched more rapidly than the $SiO_2$ thermal oxide film. Therefore, 0.05 nm/sec which is the etching speed of the $SiO_2$ thermal oxide film is used as a rough indication of the etching conditions. That is, in a strict sense, a product of 0.05 nm/sec which is the etching speed and the etching time taken for etching the film up to the substrate F does not represent the distance between the surface of the thin film layer H and the substrate F.

Therefore, the thickness of the thin film layer H is determined by separate measurement and, based on the determined thickness and the etching time taken for etching the film up to the substrate F from the surface of the thin film layer H, the "distance from the surface of the thin film layer H in the thickness direction of the thin film layer H" is made to correspond to the etching time.

In this manner, it is possible to prepare a carbon distribution curve in which the ordinate represents the ratio of the carbon atomic number (unit: at %), and the abscissa represents the distance (unit: nm) from the surface of the thin film layer H in the thickness direction of the thin film layer H.

First, the thickness of the thin film layer H is determined by observing a cross-section of a slice of the thin film layer, which is prepared by FIB (Focused Ion Beam) process, with a field effect scanning electron microscope (FE-SEM).

Thereafter, based on the obtained thickness and the etching time taken for etching the film up to the substrate F from the surface of the thin film layer H, the "distance from the surface of the thin film layer H in the thickness direction of the thin film layer H" is made to correspond to the etching time.

In the XPS depth profile measurement, when an etching region moves from the thin film layer H formed of materials such as $SiO_2$ and $SiO_xC_y$ to the substrate F formed of materials such as a polymer material, the measured ratio of the number of carbon atoms rapidly increases. Therefore, in the present invention, the time when a gradient attains a maximum in the region in which the "ratio of the number of carbon atoms rapidly increases" in the XPS depth profile is taken as an etching time corresponding to the boundary between the thin film layer H and the substrate F in the XPS depth profile measurement.

When the XPS depth profile measurement is performed discretely with respect to the etching time, a time when a difference of the measured values in the ratio of the carbon atomic number between two adjacent points attains the maximum in the measured time is extracted, and a midpoint between the two points is taken as the etching time corresponding to the boundary between the thin film layer H and the substrate F.

When the XPS depth profile measurement is performed continuously with respect to the thickness direction, in the region in which the "ratio of the number of carbon atoms rapidly increases", a point at which a time differential value attains a maximum, in a graph showing the ratio of the carbon atomic number relative to the etching time is taken as the etching time corresponding to the boundary between the thin film layer H and the substrate F.

In other words, by making the thickness of the thin film layer, which is obtained by observing the cross-section of a slice of the thin film layer with FE-SEM, correspond to the "etching time corresponding to the boundary between the thin film layer H and the substrate F" in the XPS depth profile, it is possible to prepare a carbon distribution curve in which the ordinate represents the ratio of the carbon atomic number, and the abscissa represents the distance from the surface of the thin film layer H in the thickness direction of the thin film layer H.

Here, in the present specification, as the "average ratio of the number of carbon atoms that is determined from the carbon distribution curve", a value obtained by calculating an average of the ratios of the number of carbon atoms included in a region between the following two points has been adopted.

First, in the laminate film of the present embodiment, the thin film layer H has a layer structure including the first layer Ha which contains a large amount of $SiO_2$, the second layer Hb which contains a large amount of $SiO_xC_y$, and the first layer Ha, in the thickness direction. Therefore, in the carbon distribution curve, a local minimum value of the ratio of the carbon atomic number corresponding to the first layer Ha seems to be present in the vicinity of the film surface and in the vicinity of the substrate F.

For this reason, when the carbon distribution curve has such local minimum values, a value obtained by calculating an average value of the ratio of the carbon atomic number that are included in a region from a local minimum value, which is in the vicinity of the uppermost surface of the thin film layer (vicinity of the point of origin) in the carbon distribution curve, to a local minimum value obtained just before the etching region moves to the substrate region in which the "ratio of the number of carbon atoms rapidly increases" in the carbon distribution curve is adopted as the aforementioned average value.

In the present specification, an "external value" refers to a local maximum value or a local minimum value of the atomic number ratio of an element with respect to the distance from the surface of the thin film layer H in the thickness direction of the thin film layer H in the distribution curve of each element.

In the present specification, the "local maximum value" refers to a point at which the value of the atomic number ratio of an element that has kept increasing begins to decrease when the distance from the surface of the thin film layer H is changed and at which the value of the atomic number ratio of the element, which is at a position determined when the distance from the surface of the thin film layer H in the thickness direction of the thin film layer H is changed further by 20 nm from the aforementioned point, decreases by 3 at % or more as compared with the value of the atomic number ratio of the element at the aforementioned point.

In the present specification, the "local minimum value" refers to a point at which the value of the atomic number ratio of an element that has kept decreasing begins to increase when the distance from the surface of the thin film layer H is changed and at which the value of the atomic number ratio of the element, which is at a position determined when the distance from the surface of the thin film layer H in the thickness direction of the thin film layer H is changed further by 20 nm from the aforementioned point, increases by 3 at % or more as compared with the value of the atomic number ratio of the element at the aforementioned point.

In a laminate film which is compared with the laminate film of the present embodiment and is configured in other ways, either or both of the vicinity of the surface and the vicinity of the substrate may not have the aforementioned local minimum value. Therefore, when the carbon distribution curve does not have such a local minimum value, a standard point for calculating the average value is set in the vicinity of the surface and in the vicinity of the substrate in the thin film layer H in the following manner.

In the vicinity of the surface, in the region in which the value of the ratio of the carbon atomic number decreases when the distance from the surface of the thin film layer H is changed, if the absolute value of a difference in the ratio of the carbon atomic number between a certain point (first point) and a point (second point), which is determined when the distance from the surface of the thin film layer H in the thickness direction of the thin film layer H is changed further by 20 nm from the certain point, becomes 5 at % or less, the second point is taken as the standard point.

In the vicinity of the substrate, in the region which is in the vicinity of the region in which the "ratio of the number of carbon atoms rapidly increases", which is the region including the boundary between the thin film layer and the substrate, and in which the value of the ratio of the carbon atomic number increases when the distance from the surface of the thin film layer H is changed, if the absolute value of a difference in the ratio of the carbon atomic number between a certain point (first point) and a point (second point), which is determined when the distance from the surface of the thin film layer H in the thickness direction of the thin film layer H is changed further by 20 nm from the certain point, becomes 5 at % or less, the first point is taken as the standard point.

When the XPS depth profile measurement for preparing the carbon distribution curve is performed discretely with respect to the thickness direction, the "average" of the ratio of the carbon atomic number is determined by calculating an arithmetic mean of the values measured respectively. When the XPS depth profile measurement is performed continuously with respect to the thickness direction, the "average value" is determined by calculating an integral value of the carbon distribution curve in the region for which the average value is to be calculated, and calculating a length of one side of a rectangle which has another side as long as the length of the region and has an area corresponding to the integral value.

(Relationship between Content Ratio of the Number of Carbon Atoms and Average Density)

The content ratio X (at %) of the number of carbon atoms and the average density d (g/cm$^3$) satisfy the condition represented by the following formula (1):

$$d > (2.22 - 0.008X) \quad (1).$$

In order to produce a laminate film satisfying the condition, it is preferable to perform drying of the substrate, which will be described later, in the steps for producing the laminate film. By sufficiently drying the substrate, the amount of an outgas generated from the substrate F is sufficiently reduced.

Here, when the difference between a refractive index of the substrate and a refractive index of the thin film layer of the laminate film in s laminate film which has transparency is large, reflection and scattering occur at the interface between the substrate and the thin film layer, and so that the transparency may be deteriorated. In this case, by adjusting the ratio of the carbon atomic number in the thin film layer within the range of the numerical values mentioned above so as to reduce the difference between the refractive index of the substrate and the refractive index of the thin film layer, the transparency of the laminate film can be improved.

For example, when the average value of the ratio of the carbon atomic number of the case which PEN is used as the substrate is from 3 to 25 at %, the laminate film exhibits a higher degree of light transmittance and have a good transparency, as compared with a case in which the average value of the ratio of the carbon atomic number is more than 25 at %.

In the laminate film of the present embodiment, since a thin film layer H which is uniform throughout the film surface and has excellent gas barrier property can be formed, the thin film layer H, preferably, is substantially uniform in the film surface direction (direction which is in parallel with the surface of the thin film layer H). In the present specification, the state in which the thin film layer H is substantially uniform in the film surface direction refers to a state in which, when the carbon distribution curve is prepared for two arbitrary measurement sites on the film surface of the thin film layer H by the XPS depth profile measurement, the carbon distribution curves obtained at the two arbitrary measurement sites have the same number of external values and the absolute values of a difference between the maximum value of the carbon atomic number ratio and the minimum value thereof in each of the carbon distribution curves are the same as each other or are different from each other with 5 at % or less.

Furthermore, in the laminate film of the present embodiment, the carbon distribution curve is preferably substantially continuous. In the present specification, the state in which the carbon distribution curve is substantially continuous refers to a state in which the carbon distribution curve does not have a part in which the ratio of the carbon atomic number discontinuously changes. Specifically, in such a carbon distribution curve, the relationship between the distance (x, unit: nm) from the surface of the thin film layer H in the thickness direction of the thin film layer H and the ratio of the carbon atomic number (C, unit: at %) satisfies the condition represented by the following formula (F1):

$$|dC/dx| \le 0.5 \quad (F1).$$

(Mode of Thin Film Layer)

In the laminate film of the present embodiment, the thickness of the thin film layer H is preferably within a range of 5 nm or more and 3000 nm or less, more preferably within a range of 10 nm or more and 2000 nm or less, and particularly preferably within a range of 100 nm or more and 1000 nm or less. When the thickness of the thin film layer H is 5 nm or more, the gas barrier properties such as an oxygen gas barrier property and a water vapor barrier property are further improved. When the thickness of the thin film layer H is 3000 nm or less, it is possible to obtain a further higher effect of restraining the deterioration of the gas barrier property caused when the film is bent.

The laminate film of the present embodiment has at least one thin film layer H that satisfies all of the aforementioned conditions (i) to (iv); however, the laminate film may have two or more thin film layers H that satisfy all of the conditions (i) to (iv). When the laminate film has two or more thin film layers H, the materials of the plurality of thin film layers H may be the same as or different from each other. In addition, when the laminate film has two or more thin film layers H, the thin film layers H may be formed either on one surface of the substrate F or on both surfaces of the substrate F. Also, the plurality of thin film layers H may include a thin film layer H that does not have a gas barrier property.

When the laminate film of the present embodiment has two or more thin film layers H, the value of the sum of the thicknesses of the thin film layers H is preferably more than 100 nm and 3000 nm or less. If the value of a sum of the thicknesses of the thin film layers H is 100 nm or more, the gas barrier property is further improved. When the value of a sum of the thicknesses of the thin film layers H is 3000 nm or less, it is possible to obtain a further higher effect of restraining the deterioration of the gas barrier property caused when the film is bent. The thickness of each of the thin film layers H is preferably more than 50 nm.

(Other Constitutions)

The laminate film of the present embodiment has the substrate F and the thin film layer H. However, the laminate film may further have a primer coating layer, a heat-sealable resin layer, an adhesive layer, and the like in accordance with the needs.

The primer coating layer can be formed of a known primer coating agent which can improve the adhesiveness between the laminate film and another layer. The heat-sealable resin layer can be formed of a known heat-sealable resin. The adhesive layer can be formed of a known adhesive. Also, a plurality of laminate films may be bonded to each other with use of the adhesive layer.

(Method for Producing Laminate Film)

Next, a method for producing the laminate film having the thin film layer which satisfies all of the aforementioned conditions (i) to (iv) will be described.

Figure 2:
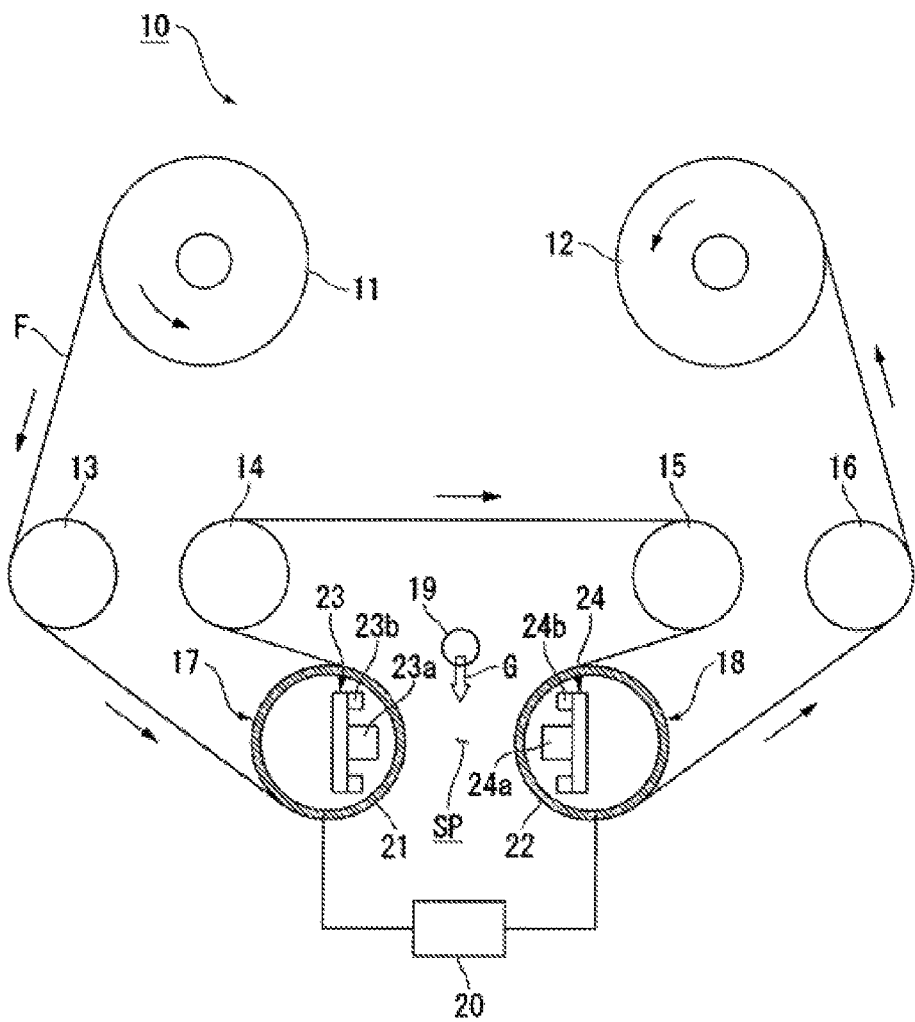
FIG. 2 is a schematic view showing one example of a production apparatus used for producing the laminate film of the present embodiment.

FIG. 2 is a schematic view showing one example of an apparatus for producing the laminate film of the present embodiment, and more specifically is a schematic view of an apparatus for forming the thin film layer by the plasma chemical vapor deposition method. Here, in FIG. 2, dimension, ratio, and the like of each of the constituent elements have been modified as appropriate in order to make it easier to see the drawings.

A production apparatus 10 shown in FIG. 2 has a feeding roll 11, a winding roll 12, transport rolls 13 to 16, a first film-forming roll 17, a second film-forming roll 18, a gas supplying pipe 19, a power source 20 for plasma generation, an electrode 21, an electrode 22, a magnetic field-forming device 23 disposed inside the first film-forming roll 17, and a magnetic field-forming device 24 disposed inside the second film-forming roll 18.

During the process of producing the laminate film, among the constituent elements of the production apparatus 10, at least the first film-forming roll 17, the second film-forming roll 18, the gas supplying pipe 19, the magnetic field-forming device 23, and the magnetic field-forming device 24 are disposed inside a vacuum chamber not shown in the drawings. The vacuum chamber is connected to a vacuum pump not shown in the drawings. The internal pressure of the vacuum chamber is controlled by operation of the vacuum pump.

If this apparatus is used, by controlling the power source 20 for plasma generation, it is possible to generate an electric discharge plasma of a film-forming gas supplied from the gas supplying pipe 19, in a space between the first film-forming roll 17 and the second film-forming roll 18, whereby it is possible to form a film by plasma CVD through a continuous film-forming process by using the generated electric discharge plasma.

The substrate F which is yet to be subjected to film formation is wound up around the feeding roll 11. The feeding roll 11 feeds the substrate F by winding off the substrate F in a lengthwise direction. The winding roll 12 is disposed in the vicinity of the end of the substrate F. The winding roll 12 winds up the substrate F which has undergone the film formation while drawing the substrate F, whereby the substrate F is wound up around the roll in the form of a roll.

The first film-forming roll 17 and the second film-forming roll 18 are arranged to extend in parallel with each other to face each other. Both of the rolls are formed of an electro-conductive material and transport the substrate F by rotating respectively. The first film-forming roll 17 and the second film-forming roll 18 preferably have the same diameter, and particularly preferably have a diameter of 5 cm or more and 100 cm or less.

Also, the first film-forming roll 17 and the second film-forming roll 18 are insulated from each other and connected to the common power source 20 for plasma generation. When an alternating-current voltage is applied from the power source 20 for plasma generation, an electric field is formed in a space SP between the first film-forming roll 17 and the second film-forming roll 18. The power source 20 for plasma generation is preferably able to apply an electric power of 100 W to 10 kW, and is preferably able to control the frequency of the alternating current to be 50 Hz to 500 kHz.

The magnetic field-forming device 23 and the magnetic field-forming device 24 are devices that form a magnetic field in the space SP, and are contained inside the first film-forming roll 17 and the second film-forming roll 18. The magnetic field-forming device 23 and the magnetic field-forming device 24 are fixed so that the magnetic field-forming device 23 and the magnetic field-forming device 24 may not rotate together with the first film-forming roll 17 and the second film-forming roll 18 (that is, so that the posture thereof relative to the vacuum chamber may not change).

The magnetic field-forming device 23 and the magnetic field-forming device 24 have central magnets 23a and 24a which extend in the same direction as the first film-forming roll 17 and the second film-forming roll 18 extend, and annular external magnets 23b and 24b which surround the central magnets 23a and 24a and are arranged to extend in the same direction as the first film-forming roll 17 and the second film-forming roll 18 extend. In the magnetic field-forming device 23, a magnetic line (magnetic field) connecting the central magnet 23a to the external magnet 23b forms an endless tunnel. Likewise, in the magnetic field-forming device 24, a magnetic line connecting the central magnet 24a to the external magnet 24b forms an endless tunnel.

By magnetron electric discharge caused when the magnetic line intersects with the electric field formed between the first film-forming roll 17 and the second film-forming roll 18, an electric discharge plasma of the film-forming gas is generated. That is, the space SP, which will be described later in detail, is used as a film-forming space for forming a film by plasma CVD. Onto a surface (film-forming surface) of the substrate F that is not in contact with the first film-forming roll 17 and the second film-forming roll 18, the film-forming gas having been in the state of plasma is deposited, whereby the thin film layer is formed.

In the vicinity of the space SP, the gas supplying pipe 19, which supplies the film-forming gas G such as a raw material gas for plasma CVD to the space SP, is disposed. The gas supplying pipe 19 is in the form of a pipe which extends in the same direction as the first film-forming roll 17 and the second film-forming roll 18 extend, and supplies the film-forming gas G to the space SP through openings placed at a plurality of sites of the pipe. In FIG. 2, a state in which the film-forming gas G is supplied to the space SP from the gas supplying pipe 19 is shown by an arrow sign.

The raw material gas may be selected and used appropriately in accordance with the material of the thin film layer to be formed. As the raw material gas, for example, organic silicon compounds may be used. Examples of the organic silicon compounds include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, octamethylcyclotetrasiloxane, dimethyldisilazane, trimethyldisilazane, tetramethyldisilazane, pentamethyldisilazane, and hexamethyldisilazane. Among these organic silicon compounds, hexamethyldisiloxane and 1,1,3,3-tetramethyldisiloxane are preferable since these compounds are superior in easiness of handling and the gas barrier property of the thin film layer. These organic silicon compounds may be used either individually as one kind or in combination of two or more kinds. Furthermore, in addition to the aforementioned organic silicon compound, monosilane may be allowed to be contained as the raw material gas, and the thus obtained gas may be used as a silicon source of the thin film layer to be formed.

As the film-forming gas, a reactant gas may be used in addition to the raw material gas. As the reactant gas, a gas which reacts with the raw material gas to be turned into an inorganic compound such as an oxide, a nitride, or an oxynitride may be selected and used. As the reactant gas for forming an oxide, for example, oxygen and ozone may be used. As the reactant gas for forming a nitride, for example, nitrogen and ammonia may be used. These reactant gases may be used either individually as one kind or in combination of two or more kinds. For example, when an oxynitride is to be formed, a reactant gas for forming an oxide and a reactant gas for forming a nitride may be used in combination.

The film-forming gas may contain a carrier gas in accordance with needs so as to supply the raw material gas into the vacuum chamber. Furthermore, as the film-forming gas, a gas for electric discharge may be used in accordance with needs so as to generate an electric discharge plasma. As the carrier gas and the gas for electric discharge, a known gas may be used. For example, it is possible to use a noble gas such as helium, argon, neon, or xenon; or hydrogen.

The internal pressure (degree of vacuum) of the vacuum chamber may be appropriately controlled according to the type of the raw material gas and the like. However, the pressure of the space SP is preferably 0.1 Pa to 50 Pa. When the low-pressure plasma CVD method is used for plasma CVD so as to inhibit a gas-phase reaction, the pressure is generally 0.1 Pa to 10 Pa. The electric power of an electrode drum of the plasma-generating device may be appropriately controlled according to the type of the raw material gas, the internal pressure of the vacuum chamber, and the like; however, the electric power is preferably 0.1 kW to 10 kW.

The transport speed (line speed) for transporting the substrate F may be appropriately controlled in accordance with the type of the raw material gas, the internal pressure of the vacuum chamber, and the like. However, the line speed is preferably 0.1 m/minute to 100 m/minute, and more preferably 0.5 m/minute to 20 m/minute, in view of the property of forming the laminate film.

In the aforementioned production apparatus 10, a film is formed on the substrate F, for example, in the following manner. The substrate F is preferably sufficiently dried before forming the film. First, a method for drying the substrate F will be described.

(Drying of Substrate)

In order to increase the density of the thin film layer, it is preferable to perform a pre-treatment before forming the film so that the amount of outgas generated from the substrate F is reduced to a sufficient degree. The amount of outgas generated from the substrate F may be determined by setting the substrate F on the production apparatus and measuring the pressure of when the internal pressure of the apparatus (internal pressure of the chamber) is reduced. For example, when the internal pressure of the chamber of the production apparatus is $1 \times 10^{-3}$ Pa or less, it can be determined that the amount of outgas generated from the substrate F has been reduced to a sufficient degree.

Examples of the method for reducing the amount of outgas generated from the substrate F include vacuum drying, heat drying, drying by a combination of these methods, and drying by natural drying. Among these methods, vacuum drying is preferable. Irrespective of which of these methods is adopted, in order to accelerate drying of the inside of the substrate F wound up in the form of a roll, it is preferable to repeat rewinding (feeding and winding) of the roll during the drying so that the entire substrate F may be dried.

The vacuum drying is performed by putting the substrate F into a pressure-resistant vacuum container and making a vacuum state by evacuating the inside of the vacuum container with use of a depressurizer such as a vacuum pump. The apparatus or the like of the plasma chemical vapor deposition method also is a pressure-resistant vacuum container, and hence can be used also as a vacuum drying apparatus. The internal pressure of the vacuum container at the time of vacuum drying is preferably 1000 Pa or less, more preferably 100 Pa or less, and still more preferably 10 Pa or less. The evacuation of the inside of the vacuum container may be continuously performed by continuously operating the depressurizer. Alternatively, the evacuation may be intermittently performed by intermittently operating the depressurizer in a state in which the internal pressure is being controlled so as not to be a value equal to or higher than a certain level. In the case in which the apparatus or the like of the plasma chemical vapor deposition method is used as a vacuum drying apparatus, it is preferable to prepare an exclusive-use vacuum drying apparatus. In the case of using the exclusive-use vacuum drying apparatus, the drying time is preferably 8 hours or longer, more preferably 1 week or longer, and still more preferably 1 month or longer.

The heat drying is performed by exposing the substrate F to an environment having a temperature higher than room temperature. The heating temperature is preferably a temperature exceeding room temperature and being 100° C. or lower, and more preferably a temperature exceeding room temperature and being 50° C. or lower. The drying time may be appropriately selected in accordance with the heating temperature and the heating means to be used.

The heating means may be one that can heat the substrate F to a temperature exceeding room temperature and being 50° C. or lower under an ordinary pressure. The heating means is preferably an infrared heating device, a microwave heating device, or a heating drum.

The infrared heating device is a device that heats an object by emitting an infrared ray from infrared-ray generating means.

The microwave heating device is a device that heats an object by emitting a microwave from microwave-generating means.

The heating drum is a device that performs heating by heating the drum surface and bringing an object into contact with the drum surface so as to heat the object from the contact part by thermal conduction.

The natural drying is performed by placing the substrate F in an atmosphere of low humidity and maintaining the atmosphere of low humidity by supplying a dry gas (for example, dry air or dry nitrogen) to the atmosphere. For performing the natural drying, it is preferable that the substrate F is placed in the low-humidity environment where the substrate F is placed, together with a desiccant such as silica gel.

The drying time is preferably 8 hours or longer, more preferably 1 week or longer, and still more preferably 1 month or longer.

The above drying methods may be performed separately before the substrate F is mounted on the production apparatus, or may be performed inside the production apparatus after the substrate F is mounted on the production apparatus.

Examples of the drying method performed after the substrate F is mounted on the production apparatus include a method of reducing the internal pressure of the chamber in a state in which the substrate F is being fed and transported from the feeding roll. In the method, the roll that the substrate passes through may have a heater, and the roll may be heated so that the roll is used as the aforementioned heating drum for heating.

As another method for reducing the outgas generated from the substrate F, a method of forming a film of an inorganic substance in advance on the surface of the substrate F can be mentioned. Examples of the method for forming a film of an inorganic substance include physical film-forming methods such as vacuum vapor deposition, (heating deposition), electron beam (EB) vapor deposition, sputtering, and ion plating. The inorganic film may be formed by chemical deposition methods such as thermal CVD, plasma CVD, and atmospheric-pressure CVD. In addition, the influence of outgas may be further reduced by performing a drying treatment on the substrate F, which has the film of an inorganic substance formed on the surface thereof, by the aforementioned drying methods.

Thereafter, the inside of the vacuum chamber not shown in the drawings is brought into a reduced-pressure environment and, by application of voltage to the first film-forming roll 17 and the second film-forming roll 18, an electric field is formed in the space SP. Preferably, an alternating-current voltage is applied.

Here, in the magnetic field-forming device 23 and the magnetic field-forming device 24, the aforementioned magnetic field having a form of an endless tunnel is formed. Therefore, when the film-forming gas is introduced, due to electrons released into the magnetic field and the space SP, electric discharge plasma of the film-forming gas having a form of a doughnut is formed along the tunnel. Since the electric discharge plasma can be generated under a low pressure of around several Pa, the internal temperature of the vacuum chamber can be made to be around room temperature.

Meanwhile, the temperature of electrons trapped at a high density in the magnetic field formed by the magnetic field-forming device 23 and the magnetic field-forming device 24 is high. Consequently, when the electrons collide with the film-forming gas, electric discharge plasma is generated. That is, due to the magnetic field and the electric field formed in the space SP, the electrons are confined in the space SP, and therefore, electric discharge plasma of a high density is formed in the space SP. Specifically, in a space overlapped with the magnetic field having a form of an endless tunnel, electric discharge plasma of a high density (high intensity) is formed while, in a space not overlapped with the magnetic field having a form of an endless tunnel, electric discharge plasma of a low density (low intensity) is formed. The intensity of these electric discharge plasmas continuously changes.

When the electric discharge plasma is generated, a large amount of radicals and ions are generated, whereby a plasma reaction proceeds, and a reaction occurs between the raw material gas and the reactant gas contained in the film-forming gas. For example, an organic silicon compound serving as the raw material gas reacts with oxygen serving as the reactant gas and, as a result, an oxidation reaction of the organic silicon compound occurs.

Here, in the space in which the electric discharge plasma of a high intensity is formed, a large amount of energy is given to the oxidation reaction. Therefore, the reaction occurs easily, and mainly a complete oxidation reaction of the organic silicon compound can be let to occur. In contrast, in the space in which the electric discharge plasma of a low intensity is formed, a small amount of energy is given to the oxidation reaction. Therefore, the reaction does not proceed easily, and mainly an incomplete oxidation reaction of the organic silicon compound can be let to occur.

Here, in the present specification, the "complete oxidation reaction of the organic silicon compound" refers to a process in which a reaction occurs between the organic silicon compound and oxygen, and the organic silicon compound is oxidized and decomposed into silicon dioxide ($SiO_2$), water, and carbon dioxide.

For example, when the film-forming gas contains hexamethyldisiloxane (HMDSO: $(CH_3)_6Si_2O$) as a raw material gas and oxygen ($O_2$) as a reactant gas, as the "complete oxidation reaction", a reaction such as described in the following formula (1) occurs, and silicon dioxide is produced.

[Chemical formula 1]

$$(CH_3)_6Si_2O + 12O_2 \rightarrow 6CO_2 + 9H_2O + 2SiO_2 \qquad (1)$$

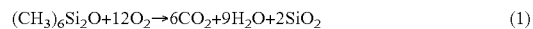

Also, in the present specification, the "incomplete oxidation reaction of the organic silicon compound" refers to a process in which, instead of the complete oxidation reaction of the organic silicon compound, a reaction that generates not $SiO_2$ but $SiO_xC_y$, ($0<x<2$, $0<y<2$) containing carbon atoms in the structure thereof occurs.

As described above, in the production apparatus 10, the electric discharge plasma having a form of a doughnut is formed on the surface of the first film-forming roll 17 and the second film-forming roll 18. Therefore, the substrate F transported onto the surface of the first film-forming roll 17 and the second film-forming roll 18 alternately passes through the space in which the high-intensity electric discharge plasma is formed and the space in which the low-intensity electric discharge plasma is formed. Consequently, on the surface of the substrate F that passes through the surface of the first film-forming roll 17 and the second film-forming roll 18, the layer (second layer Hb of FIG. 1) containing a large amount of $SiO_xC_y$ generated by the incomplete oxidation reaction is formed in a state of being interposed between layers (first layers Ha of FIG. 1) containing a large amount of $SiO_2$ generated by the complete oxidation reaction.

In addition to these, secondary electrons of a high temperature are prevented from flowing into the substrate F due to the action of the magnetic field. Therefore, it is possible to apply a high electric power while keeping the temperature of the substrate F to be low, and a film may be formed at a high speed. A film is mainly deposited only onto the film-forming surface of the substrate F, so that the film-forming rolls are not easily contaminated since the rolls are covered with the substrate F. Therefore, a film may be stably kept being formed for a long period of time.

Next, a method of controlling the average value of the ratio of the carbon atomic number in the thin film layer will be described.

Regarding the thin film layer formed using the aforementioned apparatus, in order to control the average value of the ratio of the carbon atomic number contained in the thin film layer to be 3 at % or more and 25 at % or less, for example, a film is formed using a film-forming gas obtained by mixing the raw material gas with the reactant gas in the following manner.

First, when the flow rate of oxygen is constant, if the flow rate of HMDSO is increased, the average value of the ratio of the carbon atomic number in the thin film layer increases. This is because, since the amount of HMDSO increases relative to the amount of oxygen, the reaction conditions that cause HMDSO to undergo incomplete oxidation are created, and therefore, the amount of carbon contained in the thin film layer increases.

Also, when the flow rate of HMDSO is constant, if the flow rate of oxygen is increased, the average value of the ratio of the carbon atomic number in the thin film layer decreases. This is because, since the amount of HMDSO decreases relative to the amount of oxygen, the reaction conditions become close to the conditions that cause HMDSO to undergo complete oxidation, and therefore, the amount of carbon contained in the thin film layer decreases.

In addition, for example, the amount of the film-forming gas may be fixed, and then an application voltage applied to the first film-forming roll 17 and the second film-forming roll 18 may be varied, so as to find the relationship established between variation of the voltage and the average value of the ratio of the carbon atomic number. In the same manner as described above, the application voltage at which the average value of the ratio of the carbon atomic number becomes an intended value may be determined.

By the plasma CVD method in which the film-forming conditions are specified in this manner and which uses the electric discharge plasma, the thin film layer may be formed on the substrate surface, and the laminate film of the present embodiment may be produced.

Next, a method of producing a laminate film in which the thin film layer satisfying the aforementioned conditions (i) to (iv) is formed on both surfaces of the substrate will be described.

The laminate film in which the thin film layer has been formed on the substrate surface as described above is taken out from the production apparatus, and the laminate film is mounted on the feeding roll 11 so that a thin film layer may be formed on the surface on which the thin film layer has not been formed. After the laminate film is mounted on the feeding roll 11, it is preferable to dry the laminate film in the same manner as in the above-described drying of the substrate.

When the aforementioned drying is not performed, it is preferable that the period of time from the time at which the laminate film is taken out from the production apparatus to the time at which the laminate film is mounted on the feeding roll 11 is set to be within 30 minutes, and more preferably within 10 minutes. If a long period of time is needed until the mounting is performed, it is preferable to store the laminate film in a desiccator containing a desiccant. Also, the production apparatus itself is preferably placed in a low-humidity environment such as a dry room.

The film-forming conditions after the laminate film is mounted on the feeding roll 11 may be the same as or different from the film-forming conditions at the time of producing the thin film layer which has been already formed. The film-forming conditions may also be adjusted so that warpage (curl) of the obtained two-sided laminate film may be eliminated.

Alternatively, a production apparatus may be used in which the thin film layer can be formed on both surfaces of the substrate without temporarily taking the laminate film out from the production apparatus.

In the laminate film of the present embodiment, the average density of the thin film layer is 2.12 $g/cm^3$ or higher and less than 2.25 $g/cm^3$, and preferably is 2.15 $g/cm^3$ or higher and 2.20 $g/cm^3$ or lower.

It is considered that, in the thin film layer, the layer containing a large amount of $SiO_xC_y$ generated by the incomplete oxidation reaction has a structure that is formed when oxygen atoms of the network structure of $SiO_2$ (density: 2.22 $g/cm^3$) are substituted with carbon atoms. When the layer containing a large amount of $SiO_xC_y$ has a structure that is formed when oxygen atoms of $SiO_2$ are substituted with a large amount of carbon atoms (that is, when the average value of the ratio of the carbon atomic number of the thin film layer increases), due to a difference between a bond length (about 1.63 angstroms) of an $sp^3$ bond of Si—O and a bond length (about 1.86 angstroms) of an $sp^3$ bond of Si—C, the molecular volume increases, and therefore, the average density of the thin film layer decreases.

[Organic EL Device]

Figure 3:
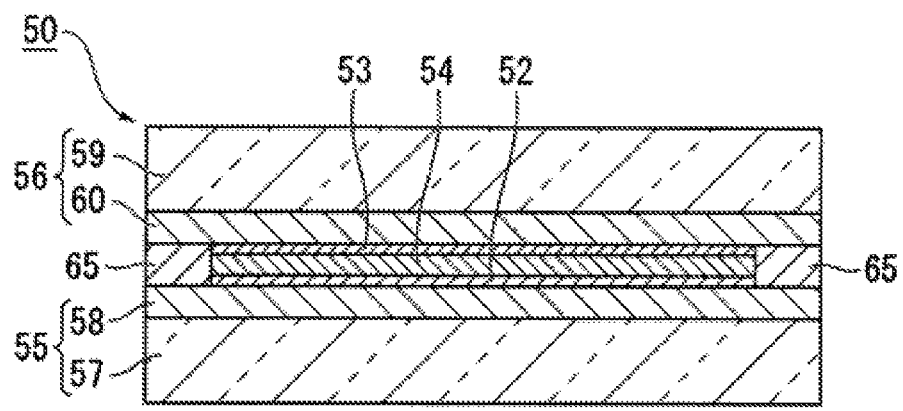
FIG. 3 is a lateral sectional view of an organic electroluminescence device of the present embodiment.

FIG. 3 is a lateral sectional view of an organic electroluminescence (organic EL) device of the present embodiment.

The organic EL device of the present embodiment is applicable to various electronic devices utilizing light. The organic EL device of the present embodiment may be a part of a display portion of, for example, a mobile device or the like, a part of an image-forming apparatus such as a printer, a light source (backlight) of, for example, a liquid crystal display panel or the like, or a light source of, for example, an illumination device or the like.

An organic EL device 50 shown in FIG. 3 has a first electrode 52, a second electrode 53, a luminescent layer 54, a laminate film 55, a laminate film 56, and a sealant 65. As the laminate films 55 and 56, the aforementioned laminate film of the present embodiment is used. The laminate film 55 has a substrate 57 and a thin film layer 58. The laminate film 56 has a substrate 59 and a thin film layer 60.

The luminescent layer 54 is disposed between the first electrode 52 and the second electrode 53, and the first electrode 52, the second electrode 53, and the luminescent layer 54 form the organic EL element. The laminate film 55 is disposed at the side of the first electrode 52 that is opposite to the luminescent layer 54. The laminate film 56 is disposed at the side of the second electrode 53 that is opposite to the luminescent layer 54. Further, the laminate film 55 and the laminate film 56 are bonded to each other by the sealant 65 which is disposed in a state of surrounding the organic EL element, and form a sealing structure that seals the inside of the organic EL element.

When an electric power is supplied between the first electrode 52 and the second electrode 53 in the organic EL device 50, carriers (electrons and holes) are supplied to the luminescent layer 54, and the luminescent layer 54 emits light. The source for supplying electric power to the organic EL device 50 may be mounted on the organic EL device 50 or may be disposed outside the device. The light emitted from the luminescent layer 54 is used for displaying or forming images or for illumination in accordance with the purpose of use or the like of an apparatus having the organic EL device 50.

In the above organic EL device 50 of the present embodiment, as materials for forming the first electrode 52, the second electrode 53, and the luminescent layer 54 (as materials for forming the organic EL element), generally known materials are used. Generally, materials for forming an organic EL device are known to deteriorate easily due to moisture or oxygen. However, in the organic EL device 50 of the present embodiment, the organic EL element is sealed by a sealing structure surrounded by the sealant 65 and the laminate films 55 and 56 of the present embodiment that can maintain a high gas barrier property even when the laminate films 55 and 56 are bent. For this reason, it is possible to obtain a highly reliable organic EL device 50 whose performance deteriorates little even when the organic EL device 50 is bent.

Here, in the above description, the organic EL device 50 of the present embodiment uses the laminate films 55 and 56 of the present embodiment. However, one of the laminate films 55 and 56 may be a gas-barrier substrate having other constitutions.

[Photoelectric Conversion Device]

Figure 4:
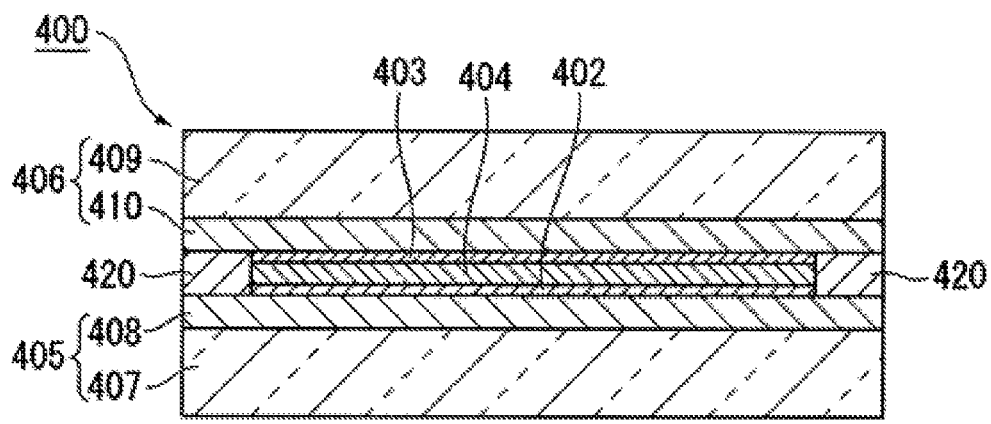
FIG. 4 is a lateral sectional view of a photoelectric conversion device of the present embodiment.

FIG. 4 is a lateral sectional view of a photoelectric conversion device of the present embodiment. The photoelectric conversion device of the present embodiment is usable for various devices that convert light energy to electric energy, such as light-detecting sensors or solar cells.

A photoelectric conversion device 400 shown in FIG. 4 has a first electrode 402, a second electrode 403, a photoelectric conversion layer 404, a laminate film 405, and a laminate film 406. The laminate film 405 has a substrate 407 and a thin film layer 408. The laminate film 406 has a substrate 409 and a thin film layer 410. The photoelectric conversion layer 404 is disposed between the first electrode 402 and the second electrode 403, and the first electrode 402, the second electrode 403, and the photoelectric conversion layer 404 form a photoelectric conversion element.

The laminate film 405 is disposed at the side of the first electrode 402 that is opposite to the photoelectric conversion layer 404. The laminate film 406 is disposed at the side of the second electrode 403 that is opposite to the photoelectric conversion layer 404. The laminate film 405 and the laminate film 406 are bonded to each other by a sealant 420 that is disposed to surround the photoelectric conversion element, and form a sealing structure that seals the inside of the photoelectric conversion element.

In the photoelectric conversion device 400, the first electrode 402 is a transparent electrode, and the second electrode 403 is a reflector electrode. In the photoelectric conversion device 400 of the present example, light energy of light having entered the photoelectric conversion layer 404 through the first electrode 402 is converted into electric energy in the photoelectric conversion layer 404. The electric energy is taken out of the photoelectric conversion device 400 via the first electrode 402 and the second electrode 403. The material and the like of the respective constituent elements, which are disposed in an optical path of the light entering the photoelectric conversion layer 404 from the outside of the photoelectric conversion device 400, are appropriately selected so that at least the part corresponding to the optical path has light permeability. The constituent elements disposed in a part not included in the optical path of the light coming from the photoelectric conversion layer 404 may be formed of materials having light permeability or materials that partially or totally block the light.

In the photoelectric conversion device 400 of the present embodiment, generally known materials are used as the first electrode 402, the second electrode 403, and the photoelectric conversion layer 404. In the photoelectric conversion device 400 of the present embodiment, the photoelectric conversion element is sealed with a sealing structure surrounded by the laminate films 405 and 406 of the present embodiment having a high gas barrier property and the sealant 420. Therefore, it is possible to obtain a highly reliable photoelectric conversion device 400 which is less likely to experience deterioration of the photoelectric conversion layer or electrodes due to oxygen or moisture in the air and less likely to show performance degradation even when the device is bent.

Here, regarding the photoelectric conversion device 400 of the present embodiment, the case in which the photoelectric conversion element is interposed between the laminate films 405 and 406 of the present embodiment has been described. However, one of the laminate films 405 and 406 may be a gas-barrier substrate having other constitutions.

Up to now, examples of the preferable embodiments according to the present invention have been described with reference to the attached drawings. However, needless to say, the present invention is not limited to these examples. The form, combination, and the like of the respective constituent members described in the above examples are merely examples, and within a range that does not depart from the gist of the present invention, these may be modified in various ways based on requirements of design and the like.

[Liquid Crystal Display]

Figure 5:
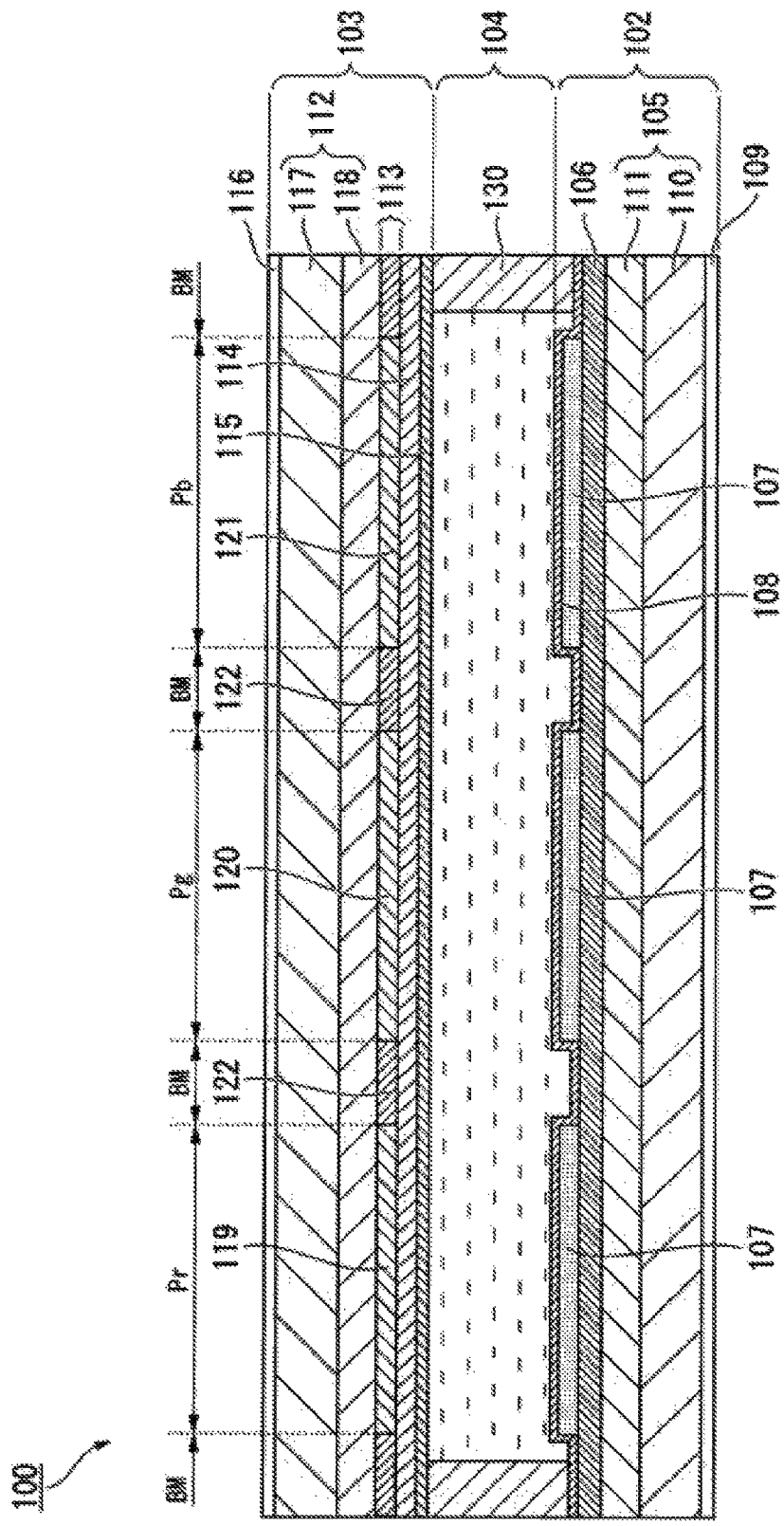
FIG. 5 is a lateral sectional view of a liquid crystal display of the present embodiment.

FIG. 5 is a lateral sectional view of a liquid crystal display of the present embodiment.

A liquid crystal display 100 shown in FIG. 5 has a first substrate 102, a second substrate 103, and a liquid crystal layer 104. The first substrate 102 is disposed to face the second substrate 103. The liquid crystal layer 104 is disposed between the first substrate 102 and the second substrate 103. The liquid crystal display 100 is produced by, for example, bonding the first substrate 102 to the second substrate 103 by using a sealant 130, and enclosing the liquid crystal layer 104 in a space surrounded by the first substrate 102, the second substrate 103, and the sealant 130.

The liquid crystal display 100 has a plurality of pixels. The plurality of pixels are arranged in the form of a matrix. The liquid crystal display 100 of the present embodiment can display a full color image. Each of the pixels of the liquid crystal display 100 has a subpixel Pr, a subpixel Pg, and a subpixel Pb. Between the subpixels, a light-shielding region BM is formed. The three types of subpixels emit color lights, which differ from each other in terms of grayscale, to the display side of an image in response to image signals. In the present embodiment, red light is emitted from the subpixel Pr; green light is emitted from the subpixel Pg; and blue light is emitted from the subpixel Pb. A combination of the lights of three colors that are emitted from the three types of subpixels is visually recognized, and as a result, one pixel of full color is displayed.

The first substrate 102 has a laminate film 105, an element layer 106, a plurality of pixel electrodes 107, an alignment film 108, and a polarizer plate 109. The pixel electrode 107 and a common electrode 114, which will be described later, form a pair of electrodes. The laminate film 105 has a substrate 110 and a thin film layer 111. The substrate 110 is in the form of a thin plate or a film. The thin film layer 111 is formed on one surface of the substrate 110. The element layer 106 is formed by being laminated on the thin film layer 111 formed on the substrate 110. Each of the plurality of pixel electrodes 107 is disposed on the element layer 106 independently for the subpixel of the liquid crystal display 100. The alignment film 108 is disposed on the pixel electrodes 107 and between the pixel electrodes 107 over the plurality of subpixels.

The second substrate 103 has a laminate film 112, a color filter 113, a common electrode 114, an alignment film 115, and a polarizer plate 116. The laminate film 112 has a substrate 117 and a thin film layer 118. The substrate 117 is in the form of a thin plate or a film. The thin film layer 118 is formed on one surface of the substrate 117. The color filter 113 is formed by being laminated on the thin film layer 111 formed on the substrate 110. The common electrode 114 is disposed on the color filter 113. The alignment film 115 is disposed on the common electrode 114.

The first substrate 102 and the second substrate 103 are disposed so that the pixel electrode 107 faces the common electrode 114, and bonded to each other in a state in which the liquid crystal layer 104 is interposed therebetween. The pixel electrodes 107, the common electrode 114, and the liquid crystal layer 104 form a liquid crystal display element. Furthermore, the laminate film 105 and the laminate film 112 form a sealing structure that seals the inside of the liquid crystal display element, in cooperation with the sealant 130 that is disposed to surround the liquid crystal display element.

In the liquid crystal display 100, the laminate film 105 and the laminate film 112 of the present embodiment having a high gas barrier property form a part of the sealing structure that seals the inside of the liquid crystal display element. Therefore, it is possible to obtain a highly reliable liquid crystal display 100 which is less likely to experience deterioration of the liquid crystal display element due to oxygen or moisture in the air and less likely to show performance degradation even when the display is bent.

Regarding the liquid crystal display 100 of the present embodiment, the case of using the laminate films 105 and 112 of the present embodiment has been described. However, one of the laminate films 105 and 112 may be a gas-barrier substrate having other constitutions.

EXAMPLES

Hereafter, the present invention will be more specifically described based on Examples and Comparative Examples. However, the present invention is not limited to the Examples given below. Each of the values measured for the laminate film was obtained by measuring the film by the following method.

[Measuring Method]
(1) Measurement of Water Vapor Permeability

The water vapor permeability of the laminate film was measured by the calcium corrosion method (method described in JP-A-2005-283561) under conditions with a temperature of 40° C. and a humidity of 90% RH.

Specifically, after a test laminate film was subjected to a drying treatment, metal calcium was vapor-deposited, and the resultant was sealed from above with metal aluminum. This was fixed onto glass, and thereafter, the sample sealed with resin was subjected to image analysis to examine the increase in the number of corroded points with lapse of time under the conditions with a temperature of 40° C. and a humidity of 90% RH, so as to calculate the water vapor permeability. In other words, images of the corroded points were captured with a microscope and taken into a personal computer, and thereafter, the images of the corroded points were digitized, and an area of corrosion was calculated so as to calculate the water vapor permeability.

(2) Measurement of Thickness of Thin Film Layer

A thickness of the thin film layer was determined by observing a cross-section of a slice of the thin film layer prepared by a Focused Ion Beam (FIB) process, by using FE-SEM (S-4700 manufactured by Hitachi High-Technologies Corporation).

(FIB Conditions)
  Apparatus: SMI-3050 (manufactured by SII NanoTechnology Inc.)
  Acceleration voltage: 30 kV
(Observation Conditions)
  Apparatus: S-4700 (manufactured by Hitachi, Ltd.)
  Acceleration voltage: 5 kV (3) Carbon Distribution Curve of Thin Film Layer Regarding the thin film layer of the laminate film, a distribution curve of carbon atoms was obtained by XPS depth profile measurement performed under the following conditions. The curve was made into a graph in which the abscissa represents a distance (nm) from the surface of the thin film layer, and the ordinate represents a percentage of the atoms of each element.

(Measurement Conditions)
  Etching ion species: argon ($Ar^+$)
  Etching rate (value as converted in terms of $SiO_2$ thermal oxide film): 0.05 nm/sec
  Etching interval (value as converted in terms of $SiO_2$ thermal oxide film): 10 nm
  X-ray photoelectron spectroscopy instrument: VG Theta Probe manufactured by Thermo Fisher Scientific K.K.
  Irradiation X-ray: single-crystal spectroscopic AlKα
  Spot shape and spot diameter of X-ray: ellipse of 800×400 µm.

(4) Measurement of Light Transmittance

A light transmittance spectrum of the laminate film was measured using a UV-visible near infrared spectrophotometer (manufactured by JASCO Corporation, trade name of Jasco V-670) based on JIS R1635, and a visible light transmittance at a wavelength of 550 nm was taken as a light transmittance of the laminate film.

(Measuring Conditions)
  Integrating sphere: None
  Range of wavelength measured: 190 to 2700 nm
  Spectrum width: 1 nm
  Wavelength scanning speed: 2000 nm/minute
  Response: Fast (5) Average Density of Thin Film Layer An average density of the thin film layer was determined by measuring a density distribution of the thin film layer by Rutherford Backscattering Spectrometry (RBS) and calculating the average density.

The measurement by the RBS method was carried out by using the following common measuring instrument.
(Measuring Instrument)
Accelerator: accelerator from National Electrostatics Corp (NEC)
Measuring instrument: end station manufactured by Evans Co., Ltd.
(Measurement by RBS Method)

Onto the thin film layer of the laminate film, He ion beams were made to be incident in a normal line direction of the surface of the thin film layer, and the energy of He ions scattering backward relative to the incidence direction was detected, so as to obtain an RBS spectrum.
(Analysis Conditions)
He$^{++}$ ion beam energy: 2.275 MeV
RBS detection angle: 160°
Grazing Angle relative to the ion beam incidence direction: about 115°
Analysis mode: RR (Rotation Random)

Example 1

A laminate film was produced using the production apparatus shown in FIG. 2. That is, a biaxially oriented polyethylene naphthalate film (PEN film, thickness: 100 µm, width: 700 mm, manufactured by Teijin DuPont Films Japan Limited, trade name of "Teonex Q65FA") was used as the substrate F (film), and this was mounted on the feeding roll 11. After the substrate was mounted, the inside of the chamber was evacuated overnight; the first film-forming roll 17 and the second film-forming roll 18 were heated to 50° C.; and the substrate was passed at a transport speed of 1 m/minute, so as to dry the substrate. This operation was carried out for a sum of two times including the feeding transport and the returning transport, so as to dry the substrate sufficiently. When the first film-forming roll 17 and the second film-forming roll 18 were sufficiently cooled from 50° C. to room temperature, the forming of a film was started.

An oxygen gas serving as an electric discharge gas (functioning also as a reaction gas) was introduced between the first film-forming roll 17 and the second film-forming roll 18 where a magnetic field had been applied, and an electric power was supplied to the first film-forming roll 17 and the second film-forming roll 18, so as to generate plasma by electric discharge between the first film-forming roll 17 and the second film-forming roll 18, whereby an electric discharge region was generated. Into this electric discharge region, hexamethyldisiloxane (HMDSO) serving as a source material gas was introduced and supplied as a mixed gas, which was a mixture with the oxygen gas, so as to form a film by the plasma CVD method. The film-forming conditions at this time were with an electric power of 1.6 kW, an HMDSO flow rate of 50 sccm (0° C. being a standard, the same applies hereafter), an oxygen flow rate of 500 sccm, a pressure of 1 Pa, and a transport speed of 0.5 m/minute. This process was carried out for 5 times, so as to obtain a laminate film having the thin film layer laminated therein.

The thickness of the laminate film, which was determined by FE-SEM after this laminate film was subjected to an FIB processing treatment, was 766 nm. Also, the content ratio of the number of carbon atoms in the thin film layer contained in the laminate film, as determined by the XPS method, was 7.25 at %.

The average density of the thin film layer contained in the laminate film, as determined by the RBS method, was 2.167 g/cm$^3$, which is 2.12 g/cm$^3$ or more and less than 2.25 g/cm$^3$, and is more than 2.162 obtained by substituting the right-hand side of the formula (1) (2.22−0.008X) with the content ratio of the number of carbon atoms (7.25 at %).

The water vapor permeability of this laminate film at 40° C. and 90% RH, as determined by the Ca corrosion method, was 9.3×10$^{-6}$ g/m$^2$/day, and it was confirmed that this laminate film has an excellent gas barrier property.

Comparative Example 1

After the substrate was mounted in the same manner as in Example 1, the inside of the chamber was evacuated overnight. Thereafter, a laminate film having the thin film layer laminated therein was obtained by film forming using the plasma CVD method under the same film-forming conditions as in Example 1 except that the drying of the substrate by heating the film-forming roll and winding the substrate out was not performed.

The thickness of the laminate film, which was determined by FE-SEM after this laminate film was subjected to an FIB processing treatment, was 802 nm. Also, the content ratio of the number of carbon atoms in the thin film layer contained in the laminate film, as determined by the XPS method, was 7.12 at %.

The average density of the thin film layer contained in the laminate film, as determined by the RBS method, was 2.131 g/cm$^3$, which is smaller than 2.163 obtained by substituting the right-hand side of the formula (1) (2.22−0.008X) with the content ratio of the number of carbon atoms (7.12 at %).

The water vapor permeability of this laminate film at 40° C. and 90% RH, as determined by the Ca corrosion method, was 4.8×10$^{-5}$ g/m$^2$/day.

Example 2

A laminate film having the thin film layer laminated therein was obtained by film forming using the plasma CVD method under the same conditions as in Example 1 except that the mixing ratio of hexamethyldisiloxane (HMDSO) serving as a source material gas and the oxygen gas was changed. The film-forming conditions at this time were with an HMDSO flow rate of 50 sccm and an oxygen flow rate of 450 sccm.

The thickness of the laminate film, which was determined by FE-SEM after this laminate film was subjected to an FIB processing treatment, was 826 nm. Also, the content ratio of the number of carbon atoms in the thin film layer contained in the laminate film, as determined by the XPS method, was 8.95 at %.

The average density of the thin film layer contained in the laminate film, as determined by the RBS method, was 2.155 g/cm$^3$, which is above or equal to 2.12 g/cm$^3$ and smaller than 2.25 g/cm$^3$, and is larger than 2.148 g/cm$^3$ obtained by substituting the right-hand side of the formula (1) (2.22−0.008X) with the content ratio of the number of carbon atoms (8.95 at %).

The water vapor permeability of this laminate film at 40° C. and 90% RH, as determined by the Ca corrosion method, was 9.3×10$^{-6}$ g/m$^2$/day, and it was confirmed that this laminate film has an excellent gas barrier property.

Example 3

A laminate film having the thin film layer laminated therein was obtained by film forming using the plasma CVD method under the same conditions as in Example 1 except that the mixing ratio of hexamethyldisiloxane (HMDSO) serving as a source material gas and the oxygen gas was changed, and that the transport speed was changed to a speed of 80% of that of Example 1. The film-forming conditions at this time were with an HMDSO flow rate of 50 sccm, an oxygen flow rate of 400 sccm, and a transport speed of 0.4 m/minute.

The thickness of the laminate film, which was determined by FE-SEM after this laminate film was subjected to an FIB processing treatment, was 980 nm. Also, the content ratio of the number of carbon atoms in the thin film layer contained in the laminate film, as determined by the XPS method, was 11.71 at %.

The average density of the thin film layer contained in the laminate film, as determined by the RBS method, was 2.178 g/cm$^3$, which is above or equal to 2.12 g/cm$^3$ and smaller than 2.25 g/cm$^3$, and is larger than 2.126 obtained by substituting the right-hand side of the formula (1) (2.22−0.008X) with the content ratio of the number of carbon atoms (11.71 at %).

The water vapor permeability of this laminate film at 40° C. and 90% RH, as determined by the Ca corrosion method, was 4.6×10$^{-6}$ g/m$^2$/day, and it was confirmed that this laminate film has an excellent gas barrier property.

Example 4

The laminate film obtained in Example 1 is taken out from the production apparatus shown in FIG. 2, and the laminate film is mounted on the feeding roll 11 of the production apparatus shown in FIG. 2 so that a thin film layer may be formed within 30 minutes on the surface on which the thin film layer has not been formed. After the laminate film is mounted, the inside of the chamber is evacuated overnight; the first film-forming roll 17 and the second film-forming roll 18 are heated to 50° C.; and the laminate film is passed at a transport speed of 1 m/minute, so as to dry the laminate film. This operation is carried out for two times including the feeding transport and the returning transport, so as to dry the laminate film sufficiently. When the first film-forming roll 17 and the second film-forming roll 18 are sufficiently cooled from 50° C. to room temperature, the forming of the film is started. The film-forming conditions at this time are set to be with an electric power of 1.6 kW, an HMDSO flow rate of 50 sccm, an oxygen flow rate of 500 sccm, a pressure of 1 Pa, and a transport speed of 0.5 m/minute. This process is carried out for 5 times, so as to obtain a laminate film having the thin film layer formed on both surfaces of the substrate. This laminate film has an excellent gas barrier property because the thin film layer formed on both surfaces of the substrate satisfies the aforementioned conditions (i) to (iv).

INDUSTRIAL APPLICABILITY

According to the present invention, a laminate film having a high gas barrier property as well as an organic electroluminescence device, a photoelectric conversion device, and a liquid crystal display each having the laminate film can be provided.

DESCRIPTION OF REFERENCE SIGNS 10 production apparatus
11 feeding roll
12 winding roll
13 to 16 transport roll
17 first film-forming roll
18 second film-forming roll
19 gas supplying pipe
20 power source for plasma generation
21, 22 electrode
23, 24 magnetic field-forming device
23a, 24a central magnet
23b, 24b external magnet
50 organic EL device
52, 402 first electrode
53, 403 second electrode
54 luminescent layer
55, 56, 105, 112, 405, 406 laminate film
57, 59, 110, 117, F substrate
58, 60, 111, 118 thin film layer
65, 130, 420 sealant
100 liquid crystal display
102 first substrate
103 second substrate
104 liquid crystal layer
106 element layer
107 pixel electrode
108, 115 alignment film
109, 116 polarizer plate
113 color filter
114 common electrode
400 photoelectric conversion device
404 photoelectric conversion layer
H thin film layer
SP space
subpixel Pr, Pg, Pb
BM light-shielding region

The invention claimed is:

1. A laminate film having a substrate and at least one thin film layer which is formed on at least one surface of the substrate, wherein
   the substrate comprises a polymer material,
   and wherein at least one of the thin film layers satisfies all of the following conditions (i) to (iv):
   (i) silicon atoms, oxygen atoms, and carbon atoms are contained,
   (ii) a content ratio X (at %) of the number of carbon atoms relative to a sum of the number of silicon atoms, the number of oxygen atoms, and the number of carbon atoms is 3 to 25 at %,
   (iii) an average density d (g/cm$^3$) is 2.12 g/cm$^3$ or higher and is less than 2.25 g/cm$^3$, and
   (iv) the content ratio X (at %) of the number of carbon atoms and the average density d (g/cm$^3$) satisfy a condition represented by the following formula (1):

$$d > (2.22 - 0.008X) \qquad (1).$$

2. The laminate film according to claim 1, wherein the thin film layer is a layer which is formed by plasma chemical vapor deposition method.

3. The laminate film according to claim 2, wherein a film-forming gas used in the plasma chemical vapor deposition method contains an organic silicon compound and oxygen.

4. The laminate film according to claim 1, wherein the thin film layer is a layer which is formed by the plasma chemical vapor deposition method including disposing the substrate on a pair of film-forming rolls and generating plasma by electric discharging between the pair of film-forming rolls.

5. The laminate film according to claim 4, wherein polarities of the pair of film-forming rolls are alternately inverted in electric discharging between the pair of film-forming rolls.

6. The laminate film according to claim 4, wherein the thin film layer is a layer which is formed by the plasma chemical vapor deposition method having a magnetic field generation mechanism which is fixed, without rotating, in an inside of each of the pair of film-forming rolls.

7. The laminate film according to claim 1, wherein the substrate is formed of at least one type of resin selected from the group consisting of a polyester resin and a polyolefin resin.

8. The laminate film according to claim 1, wherein the substrate is formed of at least one type of resin selected from the group consisting of polyethylene terephthalate and polyethylene naphthalate.

9. An organic electroluminescence device having the laminate film according to claim 1.

10. A photoelectric conversion device having the laminate film according to claim 1.

11. A liquid crystal display having the laminate film according to claim 1.

12. The laminate film according to claim 1, wherein the substrate is a flexible film formed of the polymer material.

* * * * *